(12) United States Patent
Leslie et al.

(10) Patent No.: US 11,837,580 B2
(45) Date of Patent: Dec. 5, 2023

(54) APPARATUSES AND METHODS FOR COUPLING A PLURALITY OF SEMICONDUCTOR DEVICES

(71) Applicant: MICRON TECHNOLOGY, INC., Boise, ID (US)

(72) Inventors: Matthew B. Leslie, Boise, ID (US); Timothy M. Hollis, Boise, ID (US); Roy E. Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/349,657

(22) Filed: Jun. 16, 2021

(65) Prior Publication Data
US 2021/0391305 A1 Dec. 16, 2021

Related U.S. Application Data

(60) Provisional application No. 63/039,880, filed on Jun. 16, 2020.

(51) Int. Cl.
*H01L 25/065* (2023.01)
*H01L 25/18* (2023.01)

(52) U.S. Cl.
CPC .......... *H01L 25/0657* (2013.01); *H01L 25/18* (2013.01); *H01L 2225/0651* (2013.01); *H01L 2225/06506* (2013.01); *H01L 2225/06562* (2013.01)

(58) Field of Classification Search
CPC ............................................. H01L 2225/06562
See application file for complete search history.

(56) References Cited

U.S. PATENT DOCUMENTS

| 2012/0080806 A1* | 4/2012 | Song | H01L 22/32 |
| | | | 257/E23.024 |
| 2021/0351152 A1* | 11/2021 | Zhang | H01L 25/50 |

* cited by examiner

*Primary Examiner* — Yu-Hsi D Sun
(74) *Attorney, Agent, or Firm* — Dorsey & Whitney LLP (57) ABSTRACT

Apparatuses and methods for coupling semiconductor devices are disclosed. In a group of semiconductor devices (e.g., a stack of semiconductor devices), a signal is provided to a point of coupling at an intermediate semiconductor device of the group, and the signal is propagated away from the point of coupling over different (e.g., opposite) signal paths to other semiconductor devices of the group. Loading from the point of coupling at the intermediate semiconductor device to other semiconductor devices of a group may be more balanced than, for example, having a point of coupling at semiconductor device at an end of the group (e.g., a lowest semiconductor device of a stack, a highest semiconductor device of the stack, etc.) and providing a signal therefrom. The more balanced topology may reduce a timing difference between when signals arrive at each of the semiconductor devices.

16 Claims, 8 Drawing Sheets

APPARATUSES AND METHODS FOR COUPLING A PLURALITY OF SEMICONDUCTOR DEVICES

CROSS-REFERENCE TO RELATED APPLICATION

This application claims the filing benefit of U.S. Provisional Application No. 63/039,880, filed Jun. 16, 2020. This application is incorporated by reference herein in its entirety and for all purposes.

BACKGROUND

In recent years, three-dimensional (3D) memory devices have been introduced. Some 3D memory devices are formed by stacking die vertically and coupling the die using through-silicon (or through-substrate) vias (TSVs) and/or wire bonds. Thus, 3D memory may also be referred to as "stacked memory." 3D memory may provide greater memory capacity and/or higher bandwidth with less increase in area than non-3D memory. Example 3D memory devices include Hybrid Memory Cube (HMC), High Bandwidth Memory (HBM), and Master-Slave Memory (MSM), each of which may include multiple dynamic random access memory (DRAM) die coupled to one another in a stack.

The memory device may be coupled to an external circuit that provides command, address, and data signals to the stacked die to access the memory. The stacked dies are typically coupled the external circuit at the lowest elevation die, with cascade bonds connected upwards to the rest of the die in the stack.

As memory speeds increase, however, the delay between signals arriving at the lowest elevation die and the highest elevation die in the stack becomes non-negligible. The difference in timing of the arriving signals is typically accommodated by setting operational timing of the memory device based on the worst case, that is, the signal arrival time at the highest elevation die in the stack. This approach may result in reduced performance for the memory device. Additionally, as memory speeds continue to increase, the timing difference in signal arrival time from a lowest die to a highest die in the stack may no longer be tolerable for desired system performance.

DETAILED DESCRIPTION

Apparatuses and methods for coupling semiconductor devices are disclosed. In a group of semiconductor devices (e.g., a stack of semiconductor devices), a signal is provided to a point of coupling at an intermediate semiconductor device of the group, and the signal is propagated away from the point of coupling over different (e.g., opposite) signal paths to other semiconductor devices of the group. Loading from the point of coupling at the intermediate semiconductor device to other semiconductor devices of a group may be more balanced than, for example, having a point of coupling at semiconductor device at an end of the group (e.g., a lowest semiconductor device of a stack, a highest semiconductor device of the stack, etc.) and providing a signal therefrom. The more balanced topology may reduce a timing difference between when signals arrive at each of the semiconductor devices.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
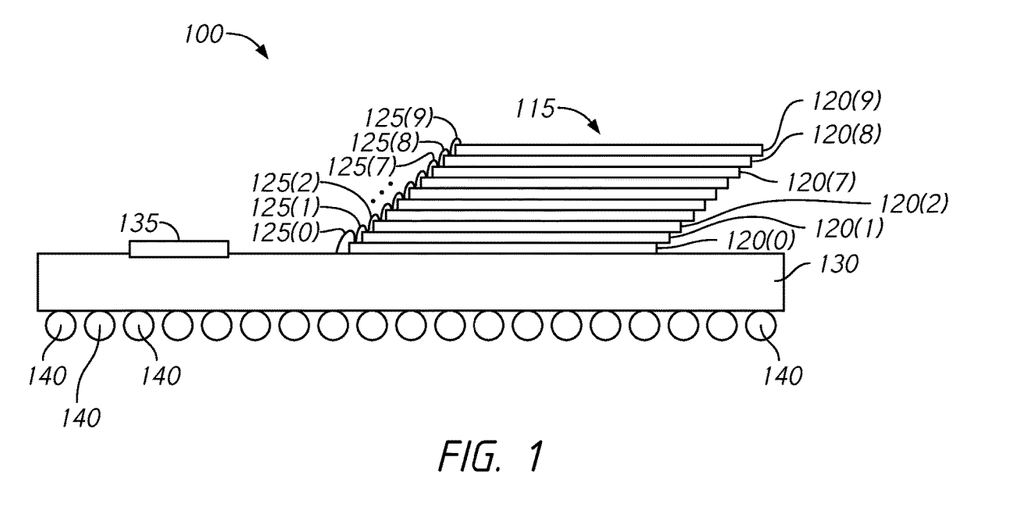
FIG. 1 is a diagram showing a multi-die device.

FIG. 1 is a diagram showing a multi-die device 100. The multi-die device 100 may include a stack 115 of semiconductor devices 120. The stack 115 is shown as including 10 semiconductor devices 120(0)-120(9). Each of the semiconductor devices 120(0)-120(9) may be, for example, a memory device, such as a dynamic random access memory (DRAM) device.

The semiconductor devices 120 of the stack 115 may be attached to one another, and the stack 115 may be attached to a substrate 130. The substrate 130 may include conductive signal lines to route signals along the substrate to and from the stack 115 of semiconductor devices 120. One or more of the signal lines may be coupled to external terminals 140, such as solder balls, or the like. Other circuits may also be attached to the substrate 130 and coupled to the conductive signals lines as well. As a result, the circuits attached to the substrate 130 may be coupled, for example, to the stack 115 of semiconductors devices 120 through the conductive signal lines. Circuit 135 attached to the substrate 130 and coupled to the stack 115 of semiconductor devices 120 is shown in FIG. 1. The circuit 135 may be a register clock driver (RCD). The RCD circuit receives and buffers signals provided to the multi-die device 100 and may provide the signals to the stack 115 of semiconductor devices 120.

The semiconductor devices 120 may be stacked in a staggered manner, providing a "shingle-stack" configuration for the stack 115. That is, the semiconductor devices 120 are offset from one another to allow edge regions of the semiconductor devices 120 to be exposed. The exposed edge regions may include bond pads to which conductors 125 are coupled. The conductors 125 may be bond wires, and the bond pads of the edge regions may be coupled together by the bond wires.

Except for the lowest elevation semiconductor device 120(0), bond pads of each semiconductor device 120 are coupled to bond pads of an immediately preceding semiconductor device 120 in the stack. For example, as shown in FIG. 1, a bond pad of semiconductor die 120(9) is coupled to a bond pad of semiconductor device 120(8) through bond wire 125(9), a bond pad of semiconductor device 120(8) is coupled to a bond pad of semiconductor device 120(7) through bond wire 125(8), a bond pad of semiconductor device 120(7) is coupled to a bond pad of semiconductor device 120(6) through bond wire 125(7), and so on down to a bond pad of semiconductor device 120(0). The semiconductor device 120(0) is coupled to the conductive signal lines of the substrate 130 through bond wire 125(0). As a result, circuits attached to the substrate 130 (e.g., circuit 135) may be coupled, for example, to the semiconductors devices 120 through the conductive signal lines and the bond wires 125.

With the arrangement shown in FIG. 1, the arrival time of a signal provided to the stack 115 (e.g., from circuit 135) is different for the semiconductor devices 120 due to the inherent propagation delay through the bond wires 125. For example, a signal first arrives at the semiconductor device 120(0) through the bond wire 125(0), then arrives at the semiconductor device 120(1) at a later time after propagating through the bond wire 125(1), then arrives at the semiconductor 120(2) at yet a later time after propagating through the bond wire 125(2), and so on, until the signal finally arrives at the semiconductor 120(9) after propagating through the bond wire 125(9). As the number of semiconductor devices 120 are included in a stack, and as memory speeds continue to increase, the time delay between the arrival time of a signal at a first one of the semiconductor devices 120 of the stack 115 and a last one of the semiconductor devices 120 may have greater impact on the performance of the multi-die device 100.

Figure 2:
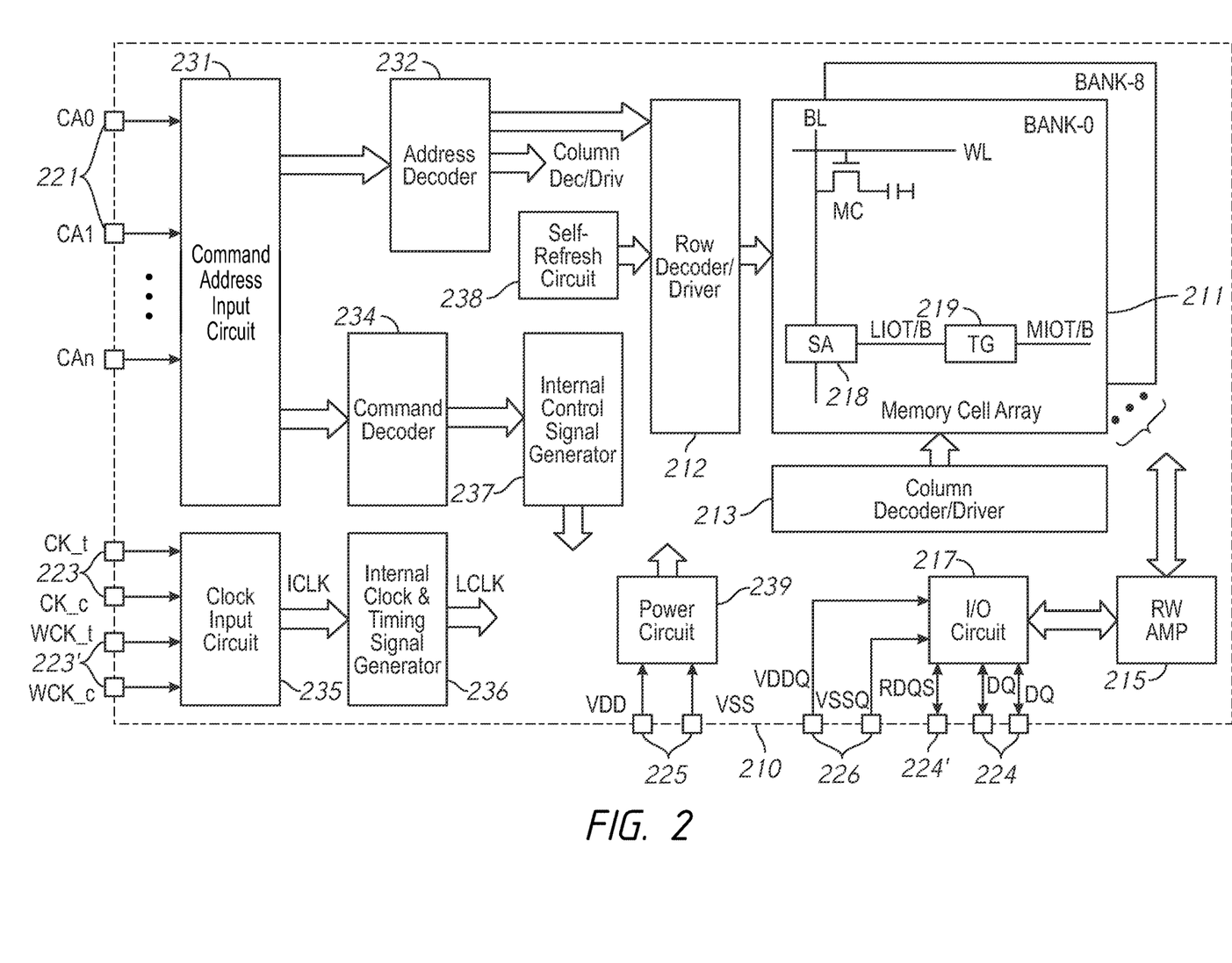
FIG. 2 is a block diagram of a semiconductor device in accordance with an embodiment of the present disclosure.

FIG. 2 is a block diagram of a semiconductor device 210 in accordance with an embodiment of the present disclosure. The semiconductor device 210 may be a memory integrated into a single semiconductor chip (e.g., a semiconductor die) in some embodiments, for example. Example memories may include volatile memory, such as dynamic random access memories (DRAMs) and static random access memories (SRAMs), and non-volatile memories, such as flash memory, resistive memories, and ferroelectric memories or any combination of the above.

The semiconductor device 210 includes a memory cell array 211. The memory cell array 211 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder/driver 212 and the selection of the bit line BL is performed by a column decoder/driver 213. Sense amplifiers 218 are coupled to corresponding bit lines BL and connected to local I/O line pairs LIOT/B. Local IO line pairs LIOT/B are connected to main IO line pairs MIOT/B via transfer gates TG 219 which function as switches.

The semiconductor device 210 includes a plurality of terminals. In some embodiments of the disclosure, the terminals may be die pads. The plurality of terminals includes command and address terminals 221, clock terminals 223 and 223', data terminals 224, a data strobe terminal 224', power supply terminals 225 and 226. The data terminals 224 may be coupled to output buffers of an input/output circuit 217 for read operations. Alternatively, the data terminals 224 may be coupled to input buffers of the input/output circuit 217 for write access of the memories responsive to a data strobe signal DQS provided at the data strobe terminal 224'.

The command and address terminals 221 are supplied with command and address signals CA, which include commands and memory addresses. The addresses provided to the command and address terminals 221 are transferred via a command and address input circuit 231 to an address decoder 232. The address decoder 232 receives the addresses and supplies a decoded row address to the row decoder/driver 212, and a decoded column address to the column decoder/driver 213. The address decoder 232 also receives a bank address and provides the bank address to the row decoder/driver 212 and/or the column decoder/driver 213. In a self-refresh mode, a self-refresh circuit 238 may provide a row address to the row/decoder driver 212 for self-refresh operation.

Commands provided to the command and address terminals 221 are provided to a command decoder 234 via the command and address input circuit 231. The command decoder 234 decodes the commands and provides the decoded commands to an internal control signal generator 237. The internal control signal generator 237 may generate various internal command signals responsive to the decoded commands from the command decoder 234. For example, the internal commands may include a row command signal to select a word line and a column command signal, such as a read command or a write command, to select a bit line.

Accordingly, when an activation command is issued and a row address is timely supplied with the activation command, and a column address is timely supplied with a read command, read data is read from a memory cell MC in the memory cell array 211 designated by the row address and column address. The read data DQ is output from the data terminals 224 via a read/write amplifier 215 and an input/output circuit 217. Similarly, when an activation command is issued and a row address is timely supplied with the activation command, and a column address is timely supplied with a write command, write data DQ supplied to the data terminals 224 is supplied via the input/output circuit 217 and the read/write amplifier 215 to the memory cell array 211 and written in the memory cell MC designated by the row address and the column address.

The clock terminals 223 are supplied with clock signals CK_t and CK_c, respectively, and clock terminal 223' are supplied with data clock signals WCK_t and WCK_c. The clock input circuit 235 receives the clock signals CK_t and CK_c and WCK_t and WCK_c and generates internal clock signals ICLK. The internal clock signals ICLK may include internal clock signals based on the clock signals CK_t and CK_c and/or internal clock signals based on the data clock signals WCK_t and WCK_c. Some or all of the internal clock signals ICLK are supplied to an internal clock and timing generator 236, which generates phase controlled internal clock signals LCLK in response. Although not limited thereto, the internal clock and timing generator 236 may include a DLL circuit. The phase controlled internal clock signals LCLK may be supplied to the input/output circuit 217 and used for timing the input and/or output of data. The internal clock and timing generator 236 may further generate various other internal clock signals for various memory operations.

The power supply terminals 225 are supplied with power supply potentials VDD and VSS. These power supply potentials VDD and VSS are supplied to a power circuit 239. The power circuit 239 may generate various internal potentials, for example, VPP, VOD, VARY, VPERI, and the like. The internal potential VPP is mainly used in the row decoder/ driver 212, the internal potentials VOD and VARY are mainly used in the sense amplifiers 218 included in the memory cell array 211, and the internal potential VPERI is used in many other circuit blocks. The power supply terminals 226 are supplied with power supply potentials VDDQ and VS SQ. These power supply potentials VDDQ and VSSQ are supplied to the input/output circuit 217. The power supply potentials VDDQ and VSSQ may be the same potentials as the power supply potentials VDD and VSS that are supplied to the power supply terminals 225, respectively. However, the power supply potentials VDDQ and VSSQ may be used for the input/output circuit 217 so that power supply noise generated by the input/output circuit 217 does not propagate to the other circuit blocks.

Figure 3:
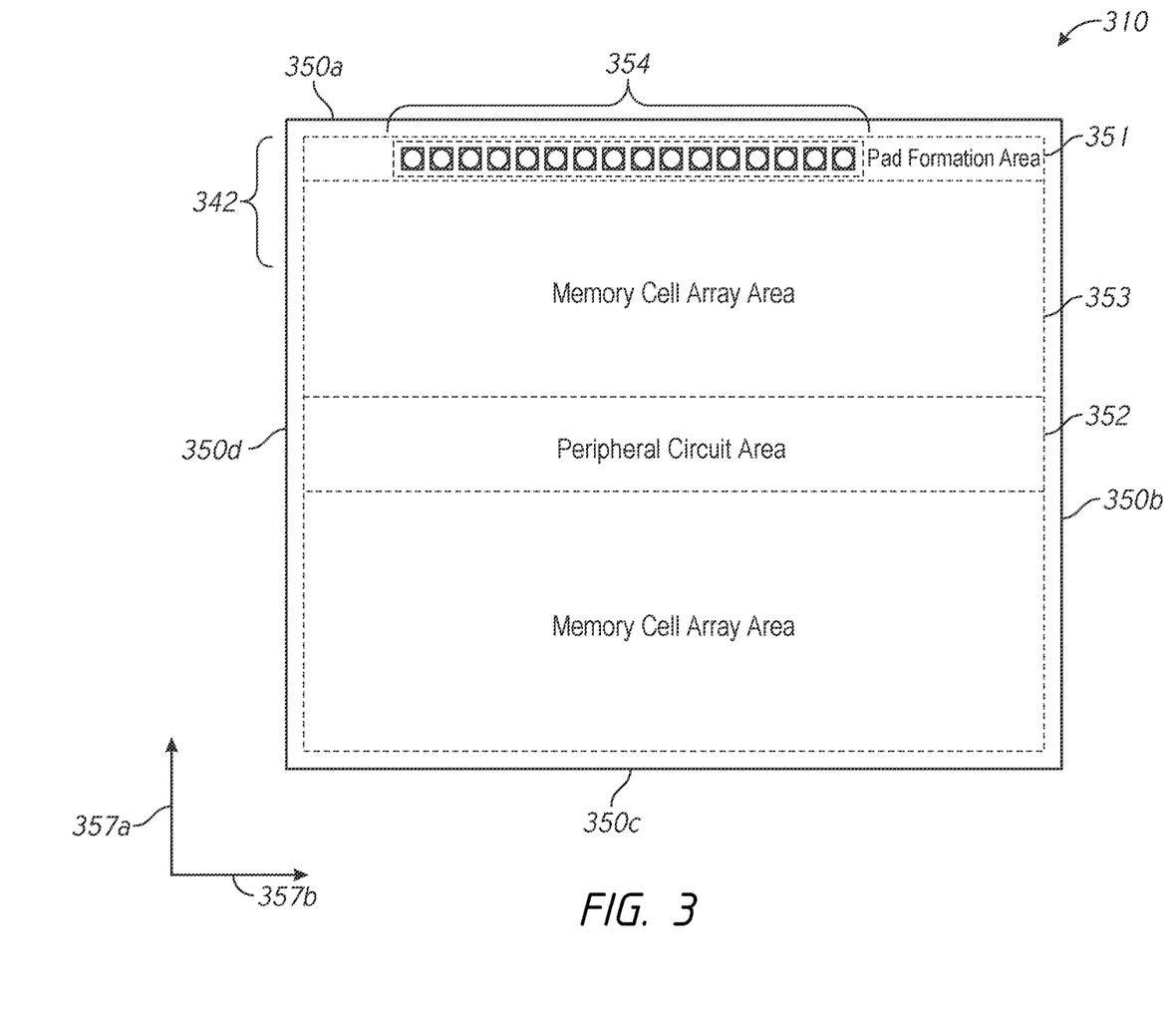
FIG. 3 is a layout diagram of a semiconductor device in accordance with one embodiment of the present disclosure.

FIG. 3 is a layout diagram of a semiconductor device 310 in accordance with one embodiment of the present disclosure. In some embodiments of the disclosure, the semiconductor device 310 includes the semiconductor device 210 of FIG. 2.

The semiconductor device 310 may have edges 350a, 350b, 350c and 350d, which define ends of the semiconductor device 310. The edges 350b and 350d may extend along a first direction 357a and the edges 350a and 350c may extend along a second direction 357b, which may perpendicular to the first direction 357a. The semiconductor device 310 may include a pad formation area 351, a peripheral circuit area 352, and memory cell array areas 353 that include memory cells, circuits, and signal lines, for example, sense amplifier circuits, address decoder circuits, data input/output lines, etc. The peripheral circuit area 352 may include various circuits and signal lines for performing various operations of the semiconductor device 310. For example, the peripheral circuit area 352 may include command and address input circuits, address and command decoders, clock circuits, power circuits, and input/output circuits. The peripheral circuit area 352 may also include terminals coupled to various circuits of the semiconductor device (e.g., as previously described for the semiconductor devices 170 of FIG. 1). The terminals may be, for example, die pads of the semiconductor device.

The pad formation area 351 may include a plurality of bond pads 354 disposed along the edge 350a. The plurality of bond pads 354 may be coupled to the terminals (e.g., die pads) of the semiconductor device and represent external terminals of the semiconductor device 310. For example, the plurality of bond pads 354 may include data terminals, command and address terminals, clock terminals, and/or power supply terminals.

Circuits included in the memory cell array area 353 and/or circuits of the peripheral circuit area 352 may be coupled to one or more bond pads 354 included in the pad formation area 351. As previously described, various circuits of the semiconductor device 300 may be coupled to the terminals (e.g., die pads). Conductive structures may be used to couple the terminals to one or more of the bond pads 354. As a result, the circuits coupled to the terminals are also coupled to the bond pads 354. The conductive structures may extend from locations of the terminals included in the memory cell array area 353 and/or the peripheral circuit area 352 to the pad formation area 351. In some embodiments of the disclosure, the conductive structures may include conductive redistribution layers (RDLs).

Figure 4:
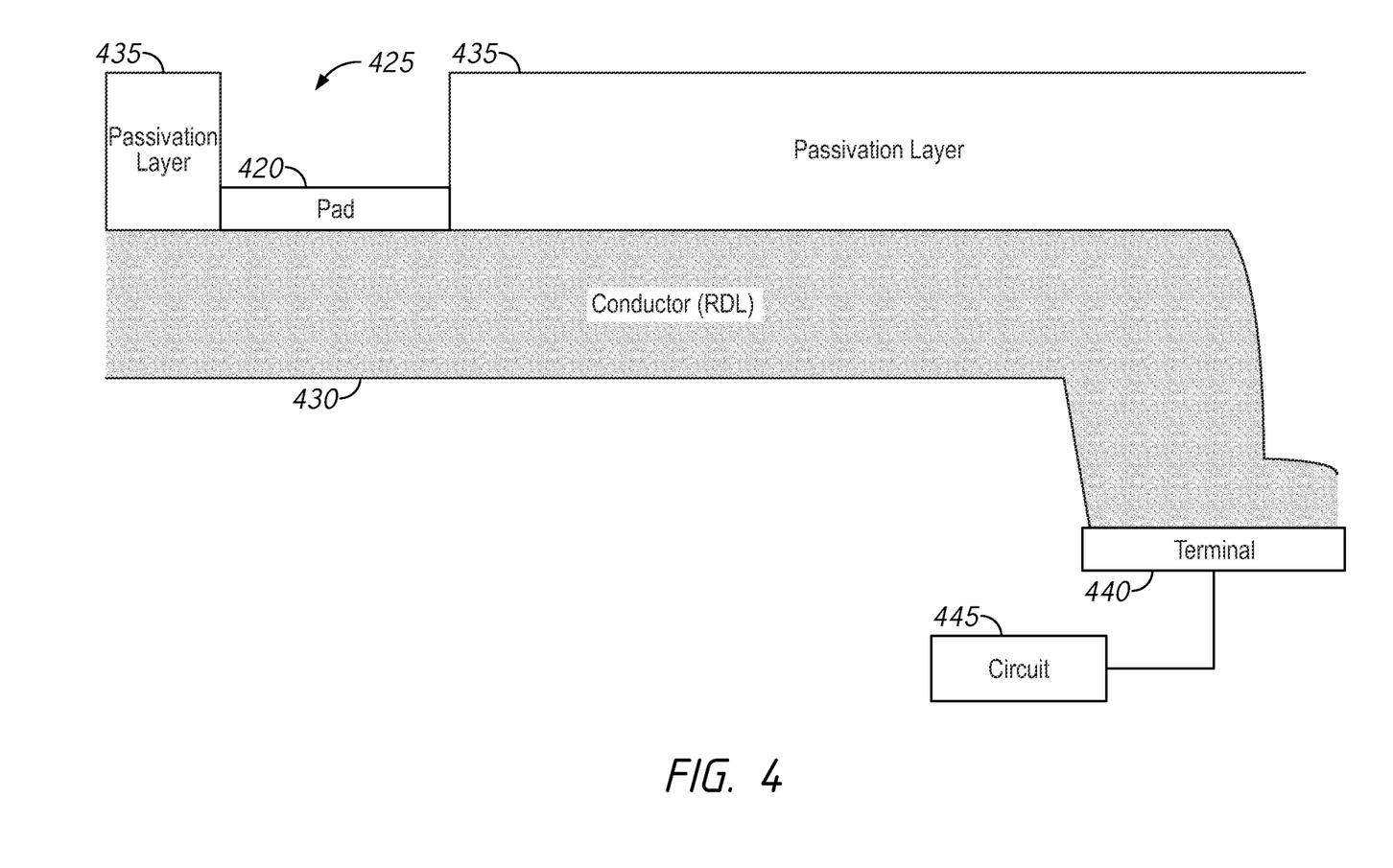
FIG. 4 is a cross sectional view of conductive structures of a semiconductor device according to an embodiment of the disclosure.

FIG. 4 is a cross sectional view of conductive structures of a semiconductor device according to an embodiment of the disclosure. In some embodiments of the disclosure, the conductive structure may be included in the semiconductor device 210 of FIG. 2, the semiconductor devices 120 of the multi-die device 100 of FIG. 1, the semiconductor device 310 of FIG. 3, and/or any semiconductor device according to an embodiment of the disclosure. For example, in some embodiments of the disclosure, the conductive structure may be included in a conductive redistribution layer (RDL) in one or more of the semiconductor devices of FIGS. 1-3.

A conductive structure 430 may couple a terminal 440 of a semiconductor device to a bond pad 420. The terminal 440 may be a die pad in some embodiments of the disclosure. The terminal 440 may be coupled to one or more circuits 445 of the semiconductor device. As a result, the bond pad 420 may be coupled to the circuits 445 through the conductive structure 430 and the terminal 440. The circuits 445 may be, for example, circuits included in a memory cell array area (e.g., memory cell array area 352 of FIG. 3) in some embodiments of the disclosure. The circuits 445 may be, for example, circuits included in a peripheral circuit area (e.g., peripheral circuit area 354 of FIG. 3) in some embodiments of the disclosure. The circuits 445 may be for performing various operations of the semiconductor device. In some embodiments of the disclosure, the circuits 445 may include command and address input circuits, address and command decoders, clock circuits, power circuits, and input/output circuits, as well as other circuits.

The bond pad 420, conductive structure 430, terminal 440, and circuits 445 of the semiconductor device may formed from semiconductor structures. The semiconductor structures may include conductive layers, conductive vias, insulating interlayers, etc. The terminal 440 may be coupled to the circuits 445 through, for example, metal layers and/or conductive vias. The conductive structure 430 may be disposed on one or more insulating interlayers. As previously described, the conductive structure 430 may be further coupled to the bond pad 420. The conductive structure 430 extends from the terminal 440 to the bond pad 420 so that the bond pad 420 and the circuit terminal 440 may be coupled together. As a result, a circuit 445 coupled to the terminal 440 may be externally accessible though the bond pad 420. The bond pad 420 may be exposed by an opening 425 in a passivation layer 435. In some embodiments of the disclosure, the passivation layer 435 may be a polyimide material.

In some embodiments of the disclosure, the conductive structure 430 may be coupled to the terminal 440 of the semiconductor device (e.g., die pad of the semiconductor device) to provide a bond pad 420 for coupling to a terminal 440 in a different location. For example, the terminal 440 may represent die pads that are generally located in a peripheral circuit region along a center region of the semiconductor device, and the conductive structure 430 may couple the die pads in the center region to bond pads 420 that are located along an edge of the semiconductor device. The bond pads 420 along an edge may be more conveniently located and provide coupling to circuits 445 of the semiconductor device, that is, through the conductive structure 430 and the terminal 440.

Figure 5:
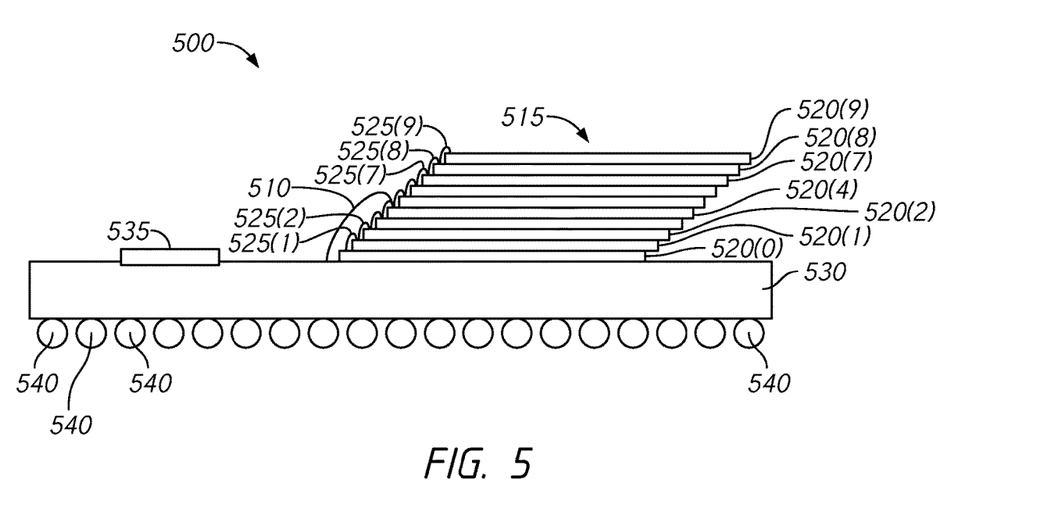
FIG. 5 is a diagram showing a multi-die device according to an embodiment of the disclosure.

FIG. 5 is a diagram showing a multi-die device 500 according to an embodiment of the disclosure. The multi-die device 500 may include a stack 515 of semiconductor devices 520. Embodiments of the disclosure are not limited to the particular number of semiconductor devices 520 included in the stack 515 shown in FIG. 5. In some embodiments of the disclosure, each of the semiconductor devices 520 includes the semiconductor device 210 of FIG. 2. Each of the semiconductor devices 520 may be, for example, a memory device, such as a dynamic random access memory (DRAM) device.

The semiconductor devices 520 of the stack 515 may be attached to one another, and the stack 515 may be attached to a substrate 530. In some embodiments of the disclosure, the semiconductor devices 520 are attached to one another and/or to the substrate 530 by an adhesive epoxy. The substrate 530 may include conductive signal lines to route signals along the substrate to and from the stack 515 of semiconductor devices 520. One or more of the signal lines may be coupled to external terminals 540. In some embodiments of the disclosure, the external terminals 540 may include solder balls, or the like. Other circuits may also be attached to the substrate 530 and coupled to the conductive signals lines as well. As a result, the circuits attached to the substrate 530 may be coupled, for example, to the stack 515 of semiconductors devices 520 through the conductive signal lines. Circuit 535 attached to the substrate 530 and coupled to the stack 515 of semiconductor devices 520 is shown in FIG. 5. The circuit 535 may be a register clock driver (RCD) in some embodiments of the disclosure. In such embodiments, the RCD circuit receives and buffers signals provided to the multi-die device 500 and may provide the signals to the stack 515 of semiconductor devices 520. Additional or alternative circuits may be included in the multi-die device 500, and/or the circuit 535 may be other circuits as well without departing from the scope of the disclosure.

The semiconductor devices 520 may be stacked in a staggered manner, providing a "shingle-stack" configuration for the stack 515. That is, the semiconductor devices 520 are offset from one another to allow edge regions of the semiconductor devices 520 to be exposed. The exposed edge regions may include bond pads to which conductors 525 are coupled. In some embodiments of the disclosure, the conductors 525 may be bond wires, and the bond pads of the edge regions may be coupled together by the bond wires.

Except for the lowest elevation semiconductor device 520(0), bond pads of each semiconductor device 520 are coupled to bond pads of at least one other semiconductor device 520 in the stack. For example, as shown in FIG. 5, a bond pad of semiconductor device 520(8) is coupled to a bond pad of semiconductor device 520(9) through conductor 525(9), and the bond pad is further coupled to a bond pad of semiconductor device 520(7) through conductor 525(8). Similarly, a bond pad of semiconductor device 520(1) is coupled to a bond pad of semiconductor device 520(2) through conductor 525(2), and the bond pad is further coupled to a bond pad of semiconductor device 520(0) through conductor 525(1).

The semiconductor device 520(4) is coupled to the conductive signal lines of the substrate 530 through source conductor 510. The source conductor 510 may be coupled, for example, to a bond pad the semiconductor device 520(4). The semiconductor device 520(4) is coupled to semiconductor device 520(3), which is coupled to semiconductor device 520(2), which is coupled to semiconductor device 520(1), which is coupled to semiconductor device 520(0). The semiconductor device 520(4) is also coupled to the semiconductor device 520(5), which is coupled to the semiconductor device 520(6), which is coupled to the semiconductor device 520(7), which is coupled to the semiconductor device 520(8), which is coupled to the semiconductor device 520(9). As a result, circuits attached to the substrate 530 (e.g., circuit 535) may be coupled, for example, to the stack 515 of semiconductors devices 520 through the conductive signal lines and the source conductor 510, and the conductors 525.

In embodiments of the disclosure, coupling to the stack 515 at an intermediate semiconductor device of the semiconductor devices 520 may reduce the difference in timing between when signals arrive at each of the semiconductor devices. An intermediate semiconductor device may be any semiconductor device between a lowest semiconductor device and a highest semiconductor device (e.g., between semiconductor device 520(0) (lowest) and semiconductor device 520(9) (highest)). Coupling to an intermediate semiconductor device of the stack 515 may provide a more balanced topology from a point of coupling.

While FIG. 5 illustrates the semiconductor devices 520 in a stack 515, in other embodiments of the disclosure, the semiconductor devices 520 may be arranged differently in a group. For example, the semiconductor devices may be arranged lined up laterally relative to one another. The point of coupling may be to an intermediate semiconductor device of the group of laterally arranged semiconductor devices. In such embodiments, a signal provided to the point of coupling may be propagated laterally in opposite directions from the point of coupling to semiconductor devices at opposite ends of the lateral arrangement of semiconductor devices. In some embodiments of the disclosure, the semiconductor devices 520 are physically positioned relative to one another in other arrangements. More generally, the scope of the disclosure is not intended to be limited to only a stacked arrangement of semiconductor devices.

For example, in the embodiment of the disclosure shown in FIG. 5, conductive signal lines of the substrate 530 are coupled to the stack 515 at intermediate semiconductor device 520(4) through source conductor 510. Loading from the point of coupling at the semiconductor device 520(4) to the lowest semiconductor device 520(0) and to the highest semiconductor device 520(9) is more balanced than, for example, having a point of coupling at the lowest semiconductor device. As a result, the difference in the timing of signals from the point of coupling at the semiconductor device 520(4) to the lowest semiconductor device 520(0) and to the highest semiconductor device 520(9) of the stack may be decreased.

It may be advantageous to have the point of coupling at an intermediate semiconductor device near a center of a group (e.g., stack) of semiconductor devices. A "center" semiconductor device is an intermediate semiconductor device of a group that may be positioned in the group so there are an equal number of semiconductor devices in either direction from the center semiconductor device to opposite end semiconductor devices. For example, in a stack of nine semiconductor devices, the center semiconductor device is the fifth semiconductor device, which is positioned in the stack so there are four semiconductor devices in a first direction to a first end semiconductor device (e.g., the lowest semiconductor device) and in a second direction to a second end semiconductor device (e.g., the highest semiconductor device). Where a group includes an even number of semiconductor devices, the center semiconductor device may be either of two semiconductor devices that are positioned in the group so there are almost an equal number of semiconductor devices (e.g., +/−1 semiconductor device) in either direction from the center semiconductor device to opposite end semiconductor devices. For example, in a stack of eight semiconductor devices, the center semiconductor device is either the fourth or fifth semiconductor device, which is positioned in the stack so there are four semiconductor devices in a first direction to a first end semiconductor device and three semiconductor devices in a second direction to a second end semiconductor device.

Figure 6:
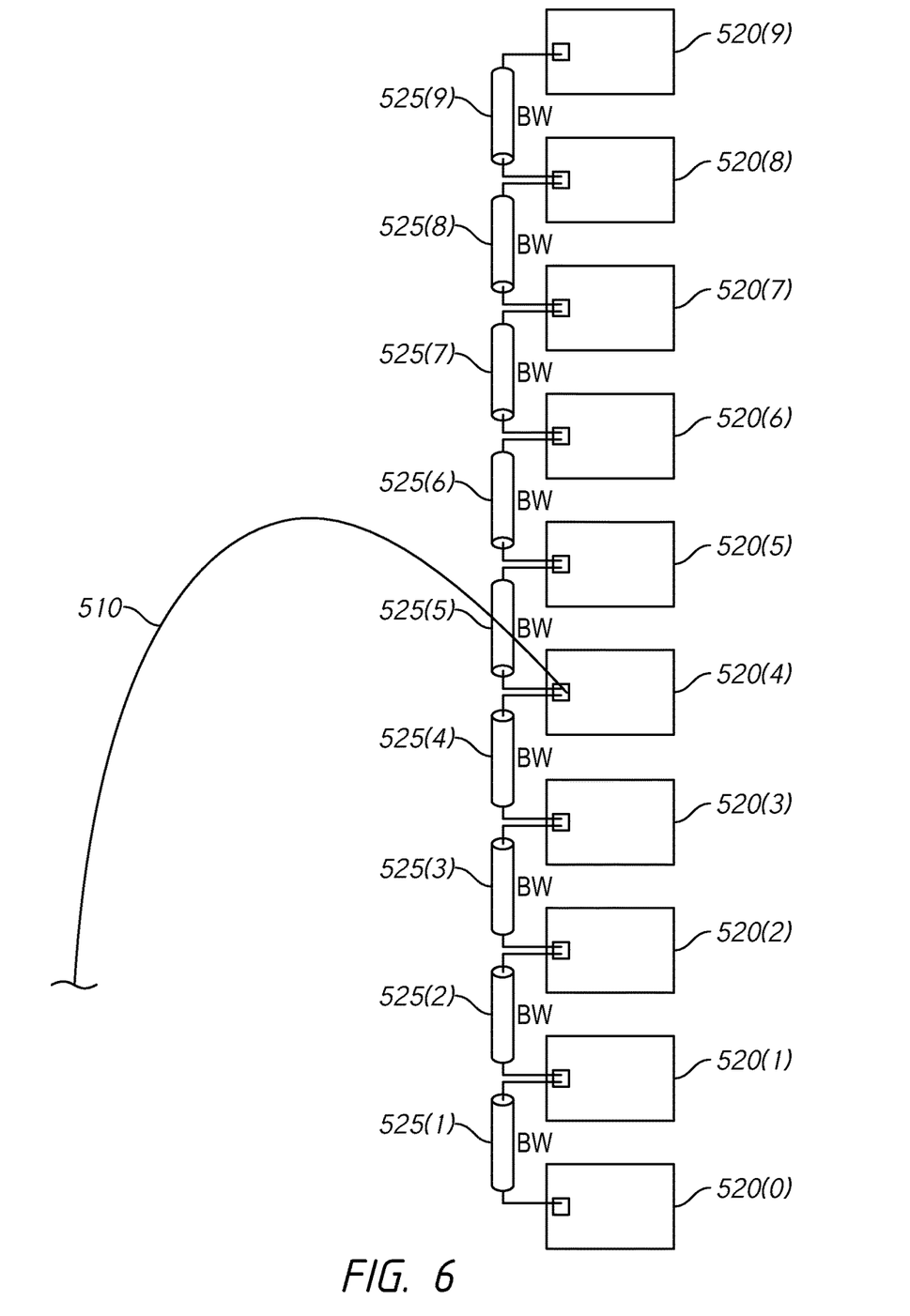
FIG. 6 is a schematic diagram of semiconductor devices coupled together according to an embodiment of the disclosure.

FIG. 6 is a schematic diagram of semiconductor devices coupled together according to an embodiment of the disclosure. In some embodiments of the disclosure, the semiconductor devices of FIG. 6 may represent the stack 515 of semiconductor devices 520 of FIG. 5. In some embodiments of the disclosure, the semiconductor devices of FIG. 6 may represent a group of semiconductor devices arranged laterally relative to one another. In some embodiments of the disclosure, the semiconductor devices of FIG. 6 may represent the semiconductor devices in other physical arrangements. For the purpose of ease of description, the semiconductor devices of FIG. 6 will be described with reference to the semiconductor devices 520 of FIG. 5. However, the semiconductor devices of FIG. 6 are not necessarily limited to such.

Bond pads of the semiconductor devices 520(0)-520(9) are coupled by conductors 525(1)-525(9). For example, a bond pad of semiconductor device 520(0) is coupled to a bond pad of semiconductor device 520(1) by conductor 525(1); the bond pad of semiconductor device 520(1) is coupled to a bond pad of semiconductor device 520(2) by conductor 525(2); the bond pad of semiconductor device 520(2) is coupled to a bond pad of semiconductor device 520(3) by conductor 525(3); the bond pad of semiconductor device 520(3) is coupled to a bond pad of semiconductor device 520(4) by conductor 525(4); the bond pad of semiconductor device 520(4) is coupled to a bond pad of semiconductor device 520(5) by conductor 525(5); the bond pad of semiconductor device 520(5) is coupled to a bond pad of semiconductor device 520(6) by conductor 525(6); the bond pad of semiconductor device 520(6) is coupled to a bond pad of semiconductor device 520(7) by conductor 525(7); the bond pad of semiconductor device 520(7) is coupled to a bond pad of semiconductor device 520(8) by conductor 525(8); and the bond pad of semiconductor device 520(8) is coupled to a bond pad of semiconductor device 520(9) by conductor 525(9).

A source conductor 510 is coupled to the bond pad of the semiconductor device 520(4). The source conductor 510 may be coupled to another circuit and/or conductive signal lines, for example, of a substrate. As a result, the circuit and/or conductive signal lines may be coupled to the other semiconductor devices.

In the example of FIG. 6, only one bond pad is shown for each of the semiconductor devices 520. However, each of the semiconductor devices 520 may include additional bond pads that may be coupled to other semiconductor devices 520 without departing from the scope of the disclosure. The bond pads of the semiconductor devices 520 may also represent one or more physical bonds pads that may be coupled together, and thus, are not limited to merely one physical bond pad to which multiple conductors are coupled. For example, in some embodiments of the disclosure, the bond pads of semiconductor devices may represent two bond pads coupled together, one bond pad coupled to a bond pad of a first adjacent semiconductor device and another bond pad coupled to a bond pad of a second adjacent semiconductor device. In some embodiments of the disclosure, the bond pads of semiconductor devices may represent three bond pads coupled together, a first bond pad coupled to a bond pad of a first adjacent semiconductor device, a second bond pad coupled to a bond pad of a second adjacent semiconductor device, and a third bond pad to which a source conductor 510 may be coupled.

The conductors 525 include inherent propagation delays which can affect the timing of when signals arrive at the respective semiconductor device. However, with the source conductor 510 coupled to an intermediate one of the semiconductor devices 520(0)-520(9), a more balanced topology may be provided. An intermediate semiconductor device may be, for example, a semiconductor device between a first end semiconductor device and a second end semiconductor device (e.g., between semiconductor device 520(0) (first end) and semiconductor device 520(9) (second end)). The more balanced topology may reduce a timing difference between when signals arrive at each of the semiconductor devices 520. For example, as shown in the example of FIG. 6, with the point of coupling at the bond pad of the semiconductor device 520(4), a signal provided on the source conductor 510 propagates through four conductors 525(4)-525(1) to arrive at the semiconductor device 520(0) (e.g., first end semiconductor device) and propagates through five conductors 525(5)-525(9) to arrive at the semiconductor device 520(9) (e.g., second end semiconductor device).

In an embodiment of the disclosure where each of the conductors 525 provide a similar propagation delay, the difference in arrival time of a signal provided on the source conductor 510 to the semiconductor device 520(0) and to the semiconductor device 520(9) is approximately the propagation delay of one conductor 525 (e.g., conductor 525(9), the fifth conductor), which may be considered in some embodiments of the disclosure to be approximately the same propagation delay to the semiconductor device 520(0) and to the semiconductor device 520(9).

In contrast, the difference in signal timing to an arrangement where a signal is first provided to semiconductor device 520(0) (e.g., a first end semiconductor device) and the signal propagates through conductors 525(1)-525(9) to the semiconductor device 520(9) may be significantly greater. For example, the signal arrives at the semiconductor device 520(9) after the propagation delays of nine conductors 525. Thus, the difference in signal timing between the semiconductor device 520(0) and the semiconductor device 520(9) is the total propagation delay of nine conductors 525, which may be a significantly longer delay than a timing difference from the propagation delay of one conductor 525, such as for the example of FIG. 6.

An arrangement of coupling a source conductor to an intermediate semiconductor device of a group of semiconductor devices (e.g., a stack of semiconductor devices) may be advantageous in reducing a timing difference of signal arrival at two end semiconductor devices. Such an arrangement may provide improved signal integrity for uni-directional signals with high loading, for example, command and address signals, chip select signals, clocks, as well as other signals. An arrangement as disclosed may also require lighter drive and lighter terminal termination (e.g., on die termination) to provide valid data eyes at a receiver circuit.

Figure 7:
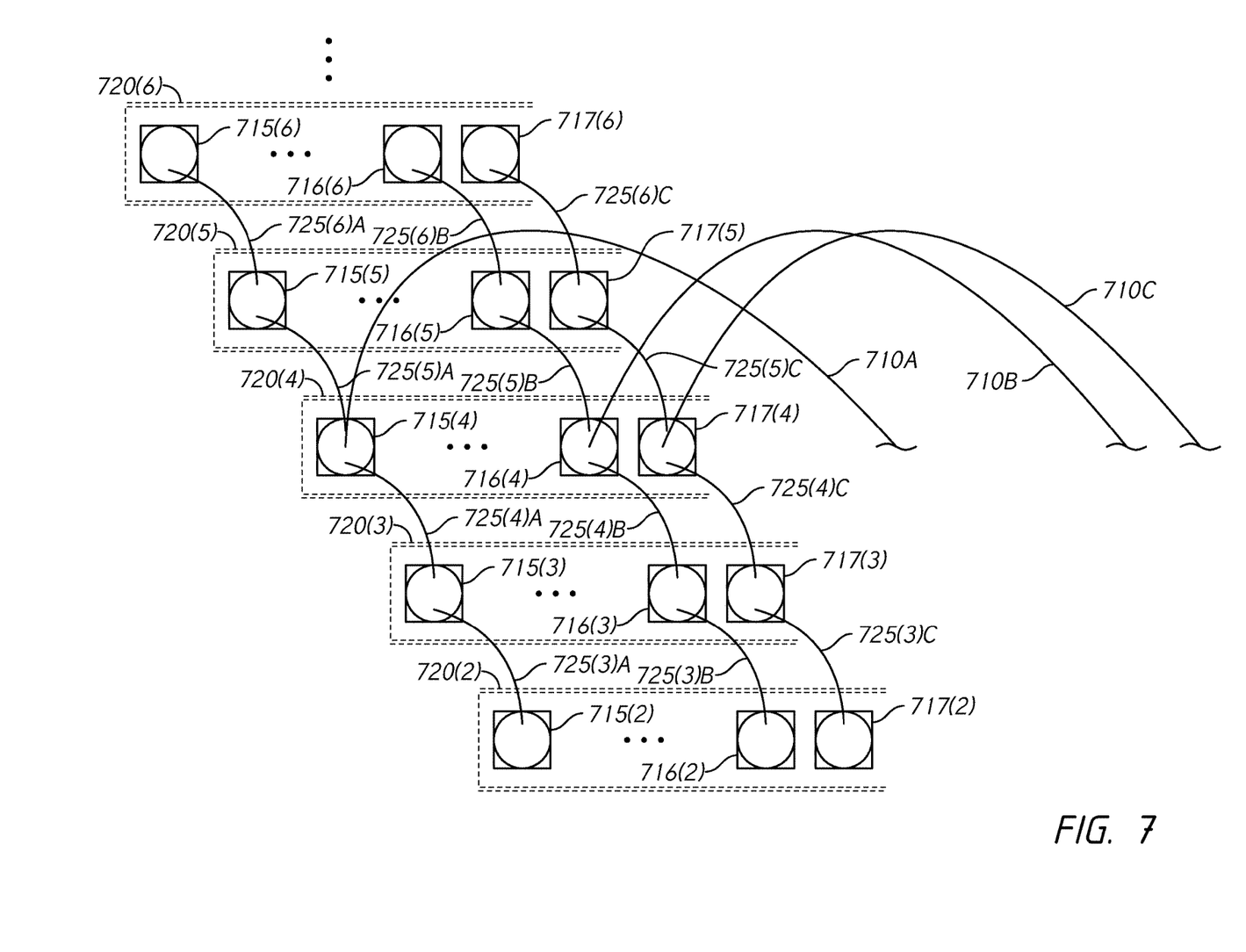
FIG. 7 is a plan diagram of bond pads of semiconductor devices coupled together according to an embodiment of the disclosure.

FIG. 7 is a plan diagram of bond pads of semiconductor devices coupled together according to an embodiments of the disclosure. While FIG. 7 shows five semiconductor devices 720(2)-720(6), additional semiconductor devices may be coupled to the semiconductor devices 720(2)-720(6) without departing from the scope of disclosure. For example, in some embodiments of the disclosure, the semiconductor devices may be included in a multi-die device (e.g., multi-die device 200 of FIG. 2) in some embodiments of the disclosure.

The bond pads 715-717 may be included in a pad formation area of respective semiconductor device 720(2)-720(6).

Corresponding bond pads of each semiconductor device are coupled together through conductors 725. For example, the bond pads 715(2)-715(6) of the semiconductor devices 720(2)-720(6) are coupled together through conductors 725(3)A-725(6)A; the bond pads 716(2)-716(6) of the semiconductor devices 720(2)-720(6) are coupled together through conductors 725(3)B-725(6)B; and the bond pads 717(2)-717(6) of the semiconductor devices 720(2)-720(6) are coupled together through conductors 725(3)C-725(6)C. While only three bond pads 715-717 are shown for each semiconductor device 720, additional bond pads may be included without departing from the scope of the disclosure.

A respective conductor 710A-710C is coupled to bond pads 715(4)-717(4) of intermediate semiconductor device 720(4). Each of the conductors 710A-710C may be coupled to circuits and/or conductive signals lines, for example, of a substrate. Signals provided on the respective conductors 710 may be provided to each of the semiconductor devices through the conductors 725 coupled to the respective bond pads 715-717. The signal timing for the signals may be more balanced by having the point of coupling at an intermediate semiconductor device, and propagating the signal away from the point of coupling to semiconductor devices on two different (e.g., opposite) signal paths through the conductors. For example, the signal timing of a signal arriving at the semiconductor device 720(2) and arriving at the semiconductor device 720(6) may be approximately equal because the propagation delay through the conductors 725 should be approximately equal from the point of coupling at the bond pads 715(4)-717(4) of the semiconductor device 720(4) to the corresponding bond pads 715(2)-717(2) of the semiconductor device 720(2), and from the point of coupling at the bond pads 715(4)-717(4) to the corresponding bond pads 715(6)-717(6) of the semiconductor device 720(6).

Figure 8:
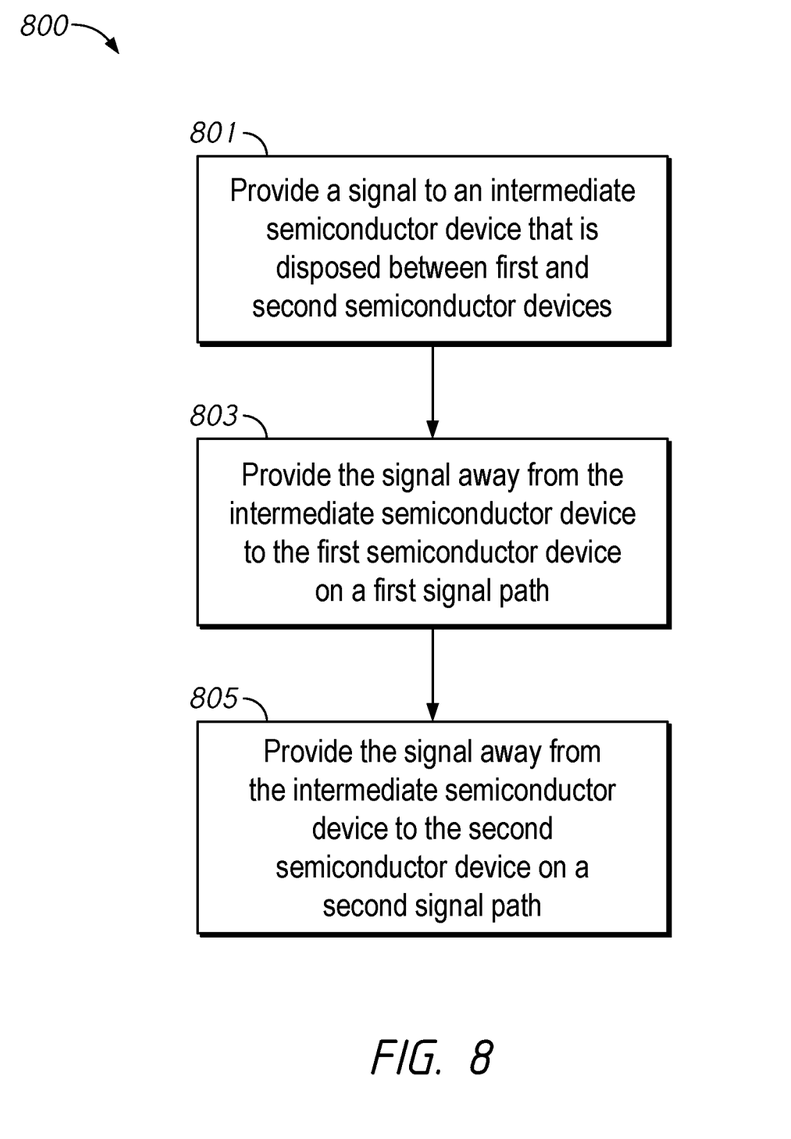
FIG. 8 is a flow diagram for providing a signal to semiconductor devices of a stack of semiconductor devices according to an embodiment of the disclosure.

FIG. 8 is a flow diagram of providing a signal to semiconductor devices of a stack of semiconductor devices according to an embodiments of the disclosure. In some embodiments of the disclosures, the semiconductor devices may be included in the stack of semiconductor devices of FIG. 5 and/or the coupled semiconductor devices of FIG. 6. In some embodiments of the disclosure, the semiconductor devices of the stack for the method of FIG. 8 may include bond pads coupled together as described with reference to FIG. 7. The semiconductor devices are memory devices, for example, DRAM devices in some embodiments of the disclosure. For the purpose of ease of description, a method 800 of the flow diagram of FIG. 8 will be described with reference to stack 515 of semiconductor devices 520 of FIG. 5. However, the method 800 of FIG. 8 is not necessarily limited to such.

At step 801 a signal is provided to an intermediate semiconductor device of a stack of semiconductor devices. The intermediate semiconductor device may be between a first semiconductor device and a second semiconductor device. For example, with reference to the stack 515 of semiconductor devices 520 of FIG. 5, the semiconductor device 520(4) may be an intermediate semiconductor device, which is between semiconductor devices 520(3) and 520(5). The signal may, for example, be a signal provided by a circuit external to the stack, such as circuit 535. As previously described, the circuit 535 and the stack 515 may be attached to a substrate that includes conductive signal lines. The signal may be provided to the semiconductor device 520(4) through the conductive signal lines and by source conductor 510 coupled to a conductive signal line and coupled to a bond pad of the semiconductor device 520(4).

At step 803 the signal is provided away from the intermediate semiconductor device to the first semiconductor device on a first signal path. For example, again with reference to the stack 515 of semiconductor devices 520 of FIG. 5, the semiconductor device 520(3) may be the first semiconductor device and the first signal path may be conductor 525(3). The conductor 525(3) may be coupled to the bond pad of the semiconductor device 520(4) and to a bond pad of the semiconductor device 520(3). The signal provided to the semiconductor device 520(4) (e.g., to the bond pad of the semiconductor device 520(4)) may be provided away from the semiconductor device 520(4) to the semiconductor device 520(3) on the conductor 525(3).

At step 805 the signal is also provided away from the intermediate semiconductor device to the second semiconductor device on a second signal path. For example, again with reference to the stack 515 of semiconductor devices 520 of FIG. 5, the semiconductor device 520(5) may be the second semiconductor device and the second signal path may be conductor 525(5). The conductor 525(5) may be coupled to the bond pad of the semiconductor device 520(4) and to a bond pad of the semiconductor device 520(5). The signal provided to the semiconductor device 520(4) may be provided away from the semiconductor device 520(4) to the semiconductor device 520(5) on the conductor 525(5). In some embodiments of the disclosure, the second signal path (e.g., conductor 525(5)) and the first signal path (e.g., conductor 525(3)) may be opposite signal paths to provide the signal away from the intermediate semiconductor device (e.g., semiconductor device 520(4)).

Signal paths (e.g., conductors 525(3) and 525(5)) include inherent propagation delays which can affect the timing of when signals arrive at the respective semiconductor devices. As previously described, providing a signal to an intermediate one of the semiconductor devices (e.g., intermediate semiconductor device 520(4)) and providing the signal away from the intermediate semiconductor device to first and second semiconductor devices on respective signal paths (e.g., semiconductor device 520(3) on conductor 525(3) and semiconductor device 520(5) on conductor 525(5)), may provide a more balanced topology. As a result, a timing difference between when signals arrive at the first and second semiconductor devices may be reduced. For example, in some embodiments of the disclosure, due to the coupling through an intermediate semiconductor device, the propagation delay of the signal through the first signal path to the first semiconductor device may be equal to the propagation delay of the signal through the second signal path to the second semiconductor device.

Certain details have been described to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a plurality of memory devices including first, second, and third memory devices, the first memory device including a first bond pad, the second memory device including a second bond pad, the third memory device including a third bond pad, the second memory device disposed between the first and third memory devices;
a first conductor coupled to the first bond pad of the first memory device and the second bond pad of the second memory device;
a second conductor coupled to the second bond pad of the second memory device and the third bond pad of the third memory device; and
a source conductor coupled to the second bond pad and at least one conductive signal line, the source conductor being configured to provide a signal to the second bond pad, wherein the first conductor provides the signal from the second bond pad to the first bond pad with a first signal timing and the second conductor provides the signal from the second bond pad to the third bond pad with a second signal timing equal to the first signal timing, wherein no source conductor directly couples the at least one conductive signal line to the first bond pad or the third bond pad, and wherein the first memory device is limited to receiving the signal at the first bond pad through the first conductor from the second bond pad and the third memory device is limited to receiving the signal at the third bond pad through the second conductor from the second bond pad.

2. The apparatus of claim 1 wherein the second memory device comprises a center memory device of the plurality of memory devices.

3. The apparatus of claim 2 wherein the plurality of memory devices further includes a fourth memory device including a fourth bond pad, the apparatus further comprising a fourth conductor coupled to the third and fourth bond pads.

4. The apparatus of claim 3 wherein the plurality of memory devices further includes a fifth memory device including a fifth bond pad, the apparatus further comprising a fifth conductor coupled to the first and fifth bond pads, wherein the signal provided through the third and fourth conductors to the fourth bond pad has a third signal timing and the signal provided through the first and fifth conductors to the fifth bond pad has a fourth signal timing equal to the third signal timing.

5. The apparatus of claim 4 wherein the first, third, fourth, and fifth conductors have a same propagation delay.

6. The apparatus of claim 1 wherein the plurality of memory devices comprises a stack of memory devices.

7. The apparatus of claim 1 wherein the plurality of memory devices comprises an even number of memory devices.

8. The apparatus of claim 1 wherein the plurality of memory devices comprises an odd number of memory devices.

9. The apparatus of claim 1 wherein the first and second conductors comprise bond wires.

10. The apparatus of claim 1 wherein a propagation delay of the signal through the first conductor and a propagation delay of the signal through the second conductor are equal.

11. An apparatus, comprising:
a stack of semiconductor devices including a lowest semiconductor device, a highest semiconductor device, and at least one intermediate semiconductor device disposed between the lowest and highest semiconductor devices;
a plurality of conductors coupled to bond pads of the semiconductor devices of the stack; and
a source conductor coupled to a point of coupling at a bond pad of one of the at least one intermediate semiconductor device and at least one conductive signal line, the at least one conductive signal line being configured to provide a signal to the bond pad of the one of the at least one intermediate semiconductor device, wherein first and second ones of the plurality of conductors are also coupled to the bond pad of the one of the at least one intermediate semiconductor device, wherein no source conductor directly couples the at least one conductive signal line to respective bond pads of the lowest semiconductor device or the highest semiconductor device, and wherein the lowest semiconductor device is limited to receiving the signal at a lowest bond pad through the first one of the plurality of conductors from the bond pad of the one of the at least one intermediate semiconductor device and the highest semiconductor device is limited to receiving the signal at a highest bond pad through the second one of the plurality of conductors from the bond pad of the one of the at least one intermediate semiconductor device.

12. The apparatus of claim 11 wherein the source conductor and the first and second ones of the plurality of conductors are configured to provide a signal to the intermediate semiconductor device and propagate the signal away from the point of coupling to semiconductor devices on two different signal paths through the first and second ones of the plurality of conductors.

13. The apparatus of claim 12 wherein first additional ones of the plurality of conductors are configured to propagate the signal from the point of coupling to the highest semiconductor device and second additional ones of the plurality of conductors are configured to propagate the signal from the point of coupling to the lowest semiconductor device.

14. The apparatus of claim 11 wherein a first number of die are between the at least one intermediate semiconductor die to which the source conductor is coupled and the highest semiconductor device and a second number of die are between the at least one intermediate semiconductor die to which the source conductor is coupled and the lowest semiconductor device, and wherein the first number and the second number are equal or within one.

15. The apparatus of claim 11, further comprising:
a substrate to which the stack of semiconductor devices are attached, the substrate including a conductive signal line to which the source conductor is coupled; and
a circuit coupled to the conductive signal line and attached to the substrate.

16. An apparatus, comprising:
a plurality of memory devices including first, second, and third memory devices, the first memory device including a first bond pad, the second memory device including a second bond pad, the third memory device including a third bond pad, the second memory device disposed between the first and third memory devices;
a first conductor coupled to the first and second bond pads;

a second conductor coupled to the second and third bond pads; and a third conductor coupled to the second bond pad and configured to provide a signal to the second bond pad, wherein the first memory device is limited to receiving the signal at the first bond pad through the first conductor from the second bond pad and the third memory device is limited to receiving the signal at the third bond pad through the second conductor from the second bond pad.

* * * * *